(12) United States Patent
Gastaldo et al.

(10) Patent No.: US 11,092,644 B2
(45) Date of Patent: *Aug. 17, 2021

(54) METHOD AND SYSTEM FOR INSPECTING BOARDS FOR MICROELECTRONICS OR OPTICS BY LASER DOPPLER EFFECT

(71) Applicant: UNITY SEMICONDUCTOR, Montbonnot-Saint-Martin (FR)

(72) Inventors: Philippe Gastaldo, Pontcharra (FR); Mayeul Durand De Gevigney, Chambéry (FR); Tristan Combier, Grenoble (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 291 days.

This patent is subject to a terminal disclaimer.

(21) Appl. No.: 16/087,056

(22) PCT Filed: Mar. 14, 2017

(86) PCT No.: PCT/EP2017/055967
§ 371 (c)(1),
(2) Date: Sep. 20, 2018

(87) PCT Pub. No.: WO2017/167573
PCT Pub. Date: Oct. 5, 2017

(65) Prior Publication Data
US 2020/0271718 A1    Aug. 27, 2020

(30) Foreign Application Priority Data

Mar. 31, 2016  (FR) ........................................ 1652835

(51) Int. Cl.
*G01R 31/308*    (2006.01)
*G01R 31/28*    (2006.01)

(52) U.S. Cl.
CPC ....... *G01R 31/308* (2013.01); *G01R 31/2831* (2013.01)

(58) Field of Classification Search
CPC ........... G01R 31/2831; G01N 21/9501; G01N 21/8806
See application file for complete search history.

(56) References Cited

U.S. PATENT DOCUMENTS

| 5,343,290 A | 8/1994 | Batchelder et al. |
| 5,710,629 A | 1/1998 | Kevorkian et al. |

(Continued)

OTHER PUBLICATIONS

French Search Report from French Patent Application No. 1652835, dated Nov. 18, 2016.

(Continued)

*Primary Examiner* — Alvaro E Fortich
(74) *Attorney, Agent, or Firm* — Greer, Burns & Crain, Ltd.

(57) ABSTRACT

A method for inspecting a wafer including:
rotating the wafer about an axis of symmetry (X) perpendicular to a main wafer surface (S);
emitting, from a light source coupled with an interferometric device, two incident light beams, to form, at the intersection between the two beams, a measurement volume (V) containing interference fringes so that a region of the main surface (S) of the wafer passes through a fringe, the dimension (Dy) of the measurement volume in a radial direction of the wafer being between 5 and 100 μm;
collecting a portion of the light scattered by the wafer region;
acquiring the collected light and emitting a signal representing the variation in the collected light intensity as a function of time; and (Continued)

detecting, a frequency component in the collected light, the frequency being the time signature of a defect passage through the measurement volume.

10 Claims, 3 Drawing Sheets

(56) References Cited

U.S. PATENT DOCUMENTS

| | | | |
|---|---|---|---|
| 5,883,714 A | 3/1999 | Jann et al. | |
| 6,108,079 A * | 8/2000 | Maeshima | G01N 21/9501 |
| | | | 250/559.33 |
| 9,857,313 B2 * | 1/2018 | Durand De Gevigney | G01N 21/8806 |
| 9,903,704 B2 * | 2/2018 | Zhu | G01B 9/02007 |
| 2002/0191179 A1 * | 12/2002 | Tukker | G01N 21/9501 |
| | | | 356/237.2 |
| 2007/0145995 A1 * | 6/2007 | Sopori | G01N 21/9501 |
| | | | 324/750.2 |
| 2009/0195786 A1 | 8/2009 | Gastaldo | |
| 2013/0155400 A1 * | 6/2013 | Nakao | G01N 21/9501 |
| | | | 356/237.2 |
| 2015/0268031 A1 * | 9/2015 | Zhu | G01B 9/02049 |
| | | | 356/486 |
| 2015/0316475 A1 * | 11/2015 | Rahman | G01N 33/4833 |
| | | | 250/339.02 |
| 2015/0330909 A1 * | 11/2015 | Koldiaev | G01R 29/24 |
| | | | 356/237.2 |
| 2018/0231370 A1 | 8/2018 | Durand De Gevigney et al. | |

OTHER PUBLICATIONS

International Search Report from International Patent Application No. PCT/EP2017/055967, dated Jun. 7, 2017.

* cited by examiner

METHOD AND SYSTEM FOR INSPECTING BOARDS FOR MICROELECTRONICS OR OPTICS BY LASER DOPPLER EFFECT

BACKGROUND

The present invention relates to a method and a system for inspecting boards or wafers for microelectronics or optics by laser Doppler effect.

During the manufacture and use of wafers for microelectronics or optics, it is usual to carry out an inspection of the surface of each wafer in order to detect any defects therein and to discover the step or steps generating these defects.

Furthermore, the inspection is generally intended not only to discover the presence or absence of defects, but also to provide qualitative and/or quantitative information on said defects, such as their location, their size and/or their nature, for example.

For these reasons of sensitivity and especially repeatability and stability of measurement, a visual inspection by an operator is not sufficient.

Inspection systems have thus been developed with a view to detecting increasingly small defects and to provide all required information on the nature, the size, the location, etc. of said defects.

These systems must also allow a duration of inspection of each wafer that is sufficiently short so as not to adversely affect production speeds.

To this end, a known technique for the inspection of wafers is dark field microscopy, which consists of emitting a beam from a light source in the direction of the wafer and measuring the intensity of the light scattered by the surface and which is present thereon. A variation in the scattered intensity therefore reveals the presence of a defect on the surface of the wafer.

Document WO 02/39099 describes a dark field system for inspecting semi-conductor wafers relying on Laser Doppler Velocimetry (LDV).

Figure 1:
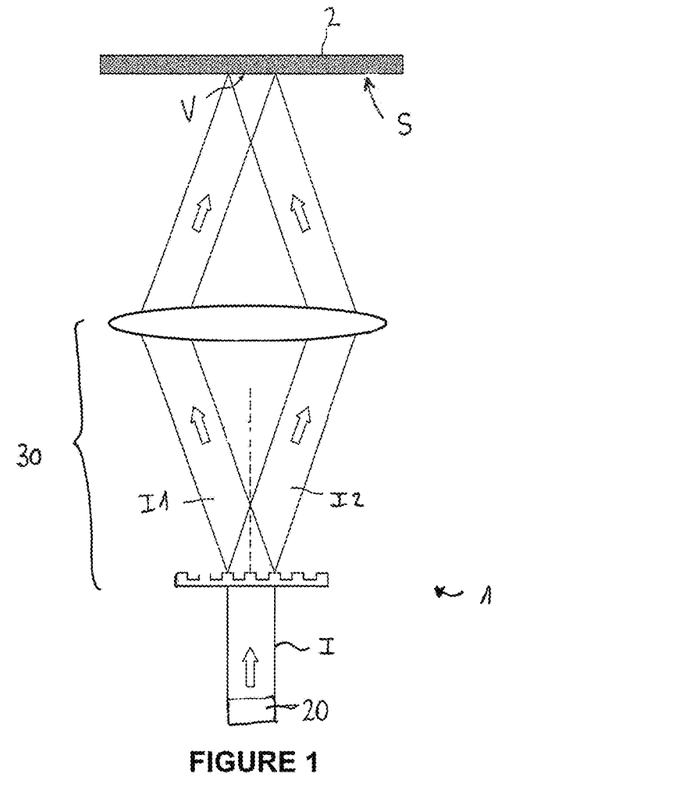
FIG. 1 is a schematic diagram of an inspection system based on laser Doppler velocimetry, described in the document WO 02/39099.

As can be seen in FIG. 1, such a system 1 comprises a light source 20 and an interferometric device 30 coupled with the light source arranged facing the surface S of the wafer 2 for inspection, which is actuated by a rotational movement. In order to form the interferometric device, a device is used to split the beam I originating from the light source 20 into two incident beams I1, I2. At the output of this beam splitter, the two beams I1, I2 are oriented in relation to one another so as to form, at their intersection, a measurement volume V comprising a plurality of parallel interference fringes. The system 1 is designed so that the surface S of the wafer passes through said measurement volume during its movement. The light scattered at the surface of the wafer is collected by mirrors and directed to an acquisition device coupled with a detection module (not shown).

The presence of a defect on the surface of the wafer results, when this defect crosses the interference fringes, in the scattering of a Doppler burst measured by the detection module. A Doppler burst is a signal that has a double frequency component: a low-frequency component, forming the envelope of the signal, corresponding to the mean light intensity scattered by the defect, and a high-frequency component, corresponding to the Doppler frequency containing the information on the velocity of the defect. The Doppler frequency $f_D$ is linked to the velocity v of movement of the defect in the direction perpendicular to the interference fringes and to the distance $\Delta$ between the interference fringes (or inter-fringe distance) by the relationship $v = f_D * \Delta$.

Document WO 2009/112704 describes another system for inspecting wafers based on Laser Doppler Velocimetry.

In the case of document WO 02/39099, the measurement volume produces, on the surface of the wafer, an elliptical spot the major axis of which is oriented in the radial direction of the wafer, the interference fringes extending transversally to the path of rotation of the wafer. The width of the elliptical spot is chosen to be sufficiently small (40 µm [micrometers]) in order to make it possible to detect accurately the angular position of the defect with respect to a reference point of the wafer. The length of the elliptical spot is chosen to be sufficiently large (2 mm [millimeters]) in order to make it possible to reduce the duration of the inspection. Furthermore, as the velocity of a defect is a function of its radial position, it is possible, by measuring the Doppler frequency of this defect, to determine the radial position of said defect with an accuracy that is greater than the size of the spot.

However, despite the utilization of the Doppler frequency, such a system has insufficient sensitivity to detect very small defects (typically, of the order of 100 nm or less). Moreover, this system does not have a sufficient radial resolution.

SUMMARY

A purpose of the invention is to resolve the aforementioned problems and to design a system and method for the inspection of wafers that offers greater sensitivity and higher radial resolution than those of the known techniques. In particular, it must be possible to detect defects having a size less than 100 nm (nanometers). Furthermore, said method must be suitable both for opaque wafers and for wafers that are at least partially transparent at the wavelength of the light source used.

According to the invention, a method is proposed for inspecting a wafer for microelectronics or optics, comprising:

rotating the wafer about an axis of symmetry perpendicular to a main surface of said wafer, emitting, from a light source coupled with an interferometric device, two incident light beams, so as to form, at the intersection between the two beams, a measurement volume containing interference fringes arranged such that a region of the main surface of the wafer passes through at least one fringe of the measurement volume, the dimension of said measurement volume in a radial direction of the wafer being comprised between 5 and 100 µm, collecting at least a portion of the light scattered by said region of the wafer, acquiring the collected light and emitting an electrical signal representing the variation in the light intensity of the collected light as a function of time, detecting, in said signal, a frequency component in said collected light, said frequency being the time signature of the passage of a defect through the measurement volume.

According to an embodiment, the dimension of the measurement volume in a direction tangential to the path of rotation of the wafer is comprised between 5 and 100 µm, preferably between 15 and 50 µm.

According to an embodiment of the invention, the wafer is at least partially transparent at the wavelength of the light source.

The dimension of the measurement volume in a direction perpendicular to the surface of the wafer is then advantageously less than or equal to a quarter of the thickness of said wafer.

Particularly advantageously, at the location of the measurement volume, incident beams have a minimum width.

According to an embodiment, the power of the light source is greater than or equal to 10 mW (milliwatts).

The wavelength of the light source is preferably less than or equal to 900 nm.

According to an embodiment, the inter-fringe distance is comprised between 0.1 and 10 µm.

A further subject relates to a system for inspecting wafers for microelectronics or optics, comprising:
- a device for driving a wafer in rotation about an axis of symmetry perpendicular to a main surface of said wafer,
- a light source suitable for emitting a light beam,
- an interferometric device coupled with the light source in order to split the beam emitted by said source into two beams and in order to form, at the intersection between the two beams, a measurement volume containing interference fringes, the dimension of said measurement volume in a radial direction of the wafer being comprised between 5 and 100 µm, the interferometric device and the drive device being arranged in relation to one another so that a region of the main surface of the wafer in rotation passes through at least one fringe of the measurement volume,
- a device for collecting light scattered by the wafer,
- a device for acquiring collected light configured in order to emit an electrical signal representing the variation in the light intensity of the collected light as a function of time,
- a processing device configured in order to detect, in said signal, a frequency component in said collected light, said frequency being the time signature of the passage of a defect through a respective measurement volume and in order to determine, based on said frequency, the position of the defect in the radial direction and/or in the thickness of the wafer.

According to an embodiment, the system also comprises an arm for moving the interferometric device and the device for collecting scattered light in translational motion in a radial direction, the light source, the acquiring device and the processing device being immobile.

Advantageously, said interferometric device is coupled with the light source by an optical fibre and said collection device is coupled with the acquisition device by an optical fibre.

BRIEF DESCRIPTION OF THE DRAWINGS

Other characteristics and advantages of the invention will become apparent from the detailed description that follows, with reference to the attached drawings in which.

In the interests of clarity, the figures are not necessarily to scale.

DETAILED DESCRIPTION

The present invention relates to any wafer intended for use in the field of microelectronics or optics, said wafer being able to be opaque or at least partially transparent at the wavelength of a beam emitted by a light source. In particular, the wafer can comprise at least one of the following materials: silicon, germanium, glass, sapphire, quartz, SiC, AsGa, GaN (non-limitative list).

The invention uses a measurement volume having a very small dimension in the radial direction, or also in the direction tangential to the rotation of the wafer.

Although this solution goes against the teaching of document WO 02/39099, the inventors have shown, as will be disclosed below, that this substantially smaller measurement volume makes it possible to obtain a much higher luminous flux and as a result, for background light of equal power, a much more favourable ratio of signal to background light, without adversely affecting the duration of inspection of the wafer.

Figure 2:
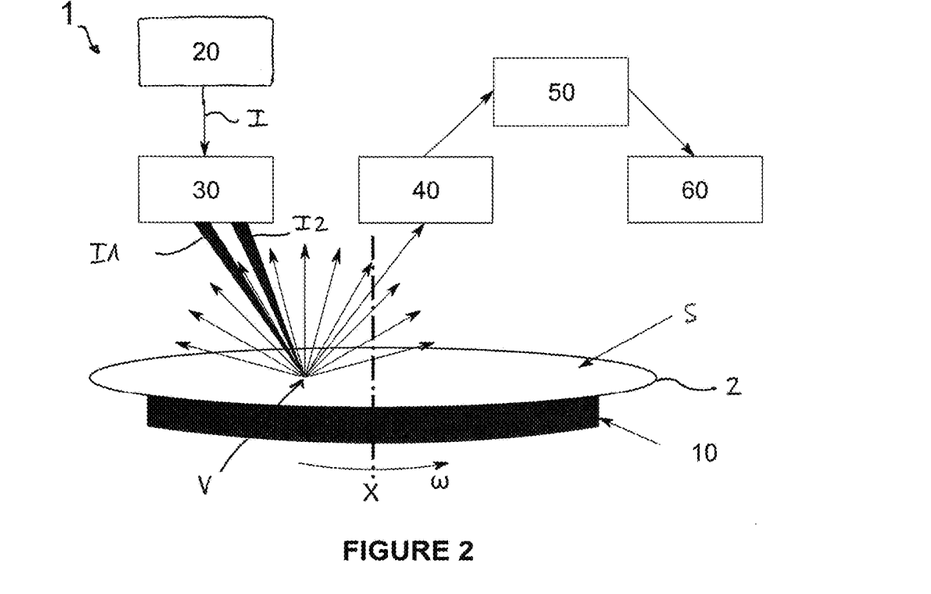
FIG. 2 is a schematic diagram of an inspection system according to an embodiment of the invention.

The principle of the inspection system 1 is shown in FIG. 2.

The system comprises a support 10 intended to receive a wafer 2 for inspection and to drive it in rotation about an axis of symmetry X of the wafer perpendicular to a main surface S of said wafer. Generally, the wafer has a circular shape but the invention is applicable to any other shape.

The wafer 2 is held on the support 10 by any appropriate means, such as electrostatic means, mechanical means, etc.

The mechanism for rotating the support is known per se and therefore will not be described in detail.

The support 10 comprises one or more encoders (not shown) making it possible to know at any moment the angular position of the wafer with respect to a reference position.

The inspection system 1 also comprises a light source 20.

The light source 20 is typically a laser of the Distributed Feed Back (DFB) type. A laser of the Fabry-Pérot type having a coherence length less than 50 µm can in some cases be used if the length of the optical paths of the two beams split in order to form the measurement volume is less than this coherence length.

The power of said light source is typically greater than or equal to 10 mW, In fact, below this power, the quantity of light scattered by defects of a size less than 100 nm becomes very small and therefore requires an acquisition time that is incompatible with the envisaged industrial application. Furthermore, the wavelength of said light source is less than or equal to 900 nm. In fact, according to Mie's law of light scattering, the power scattered by a defect of a given size increases in inverse proportion to the power four of the wavelength. Thus the smaller the incident wavelength on a defect, the more light the defect will scatter. Using a wavelength greater than 900 nm will thus generate quantities of scattered light that are too small to detect defects of a size less than 100 nm.

Figure 3:
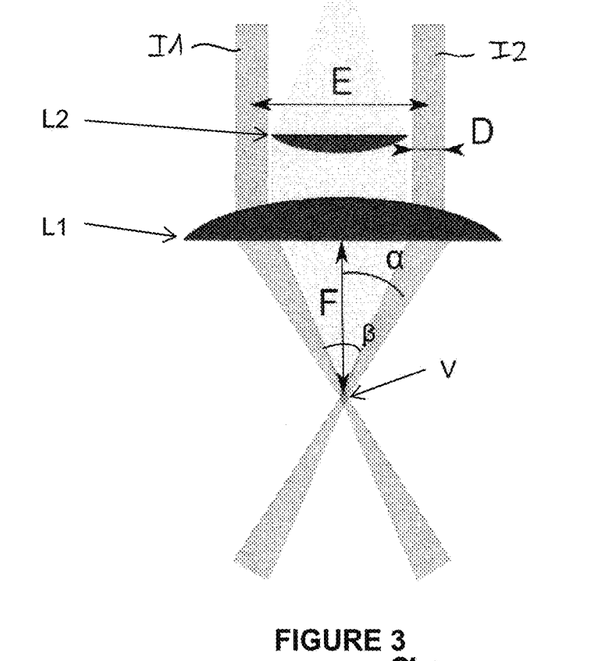
FIG. 3 is a schematic diagram of an optical system for generating and collecting interference fringes according to an embodiment of the invention.

The light source is coupled with an interferometric device 30 making it possible to generate a measurement volume comprising interference fringes shown in FIG. 3.

The interferometric device 30 comprises a light guide having two symmetrical branches the input of which is coupled with the light source 20 in order to split the beam I originating from the light source 20 into two incident beams I1, I2. Preferably, the laser beam originating from the light source is collimated. A converging lens L1, for example plane-convex, is placed in the path of the two incident beams so as to deflect each of the two beams by an angle α in order to form, at the intersection between the two beams, a measurement volume V containing interference fringes. Of course, this construction is given by way of example and any other device making it possible to form such a measurement volume can be used.

The inter-fringe (distance between two adjacent fringes) is advantageously comprised between 0.1 and 10 µm. In fact, an inter-fringe distance less than 0.1 µm would require a higher sampling frequency, which would considerably increase the acquisition time or the speed of the necessary acquisition chain. Conversely, an inter-fringe distance greater than 10 µm would imply a too small number of fringes within the measurement volume to carry out an efficient frequency detection. In addition, as the defects that the present invention intends to qualify are of a size comprised between 0.05 and 10 µm, the aforementioned inter-fringe range makes it possible to distinguish defects within this range of sizes effectively.

Figure 4:
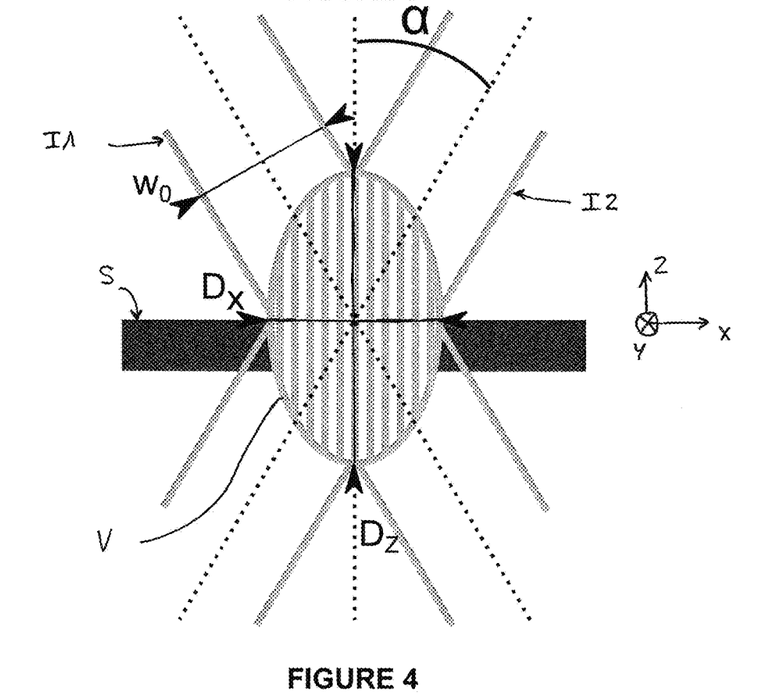
FIG. 4 is a schematic diagram of the measurement volume comprising interference fringes according to an embodiment of the invention.

The measurement volume generated by such an interferometric device is shown diagrammatically in FIG. 4.

An orthonormal reference frame (x, y, z) is defined with (x, y) in the plane of the surface of the wafer for inspection and z perpendicular to said surface (the dimension of the measurement volume in this direction being denoted Dz). In this illustration, it is assumed that y extends in the radial direction (the dimension of the measurement volume in this direction being denoted Dy and the dimension of the measurement volume in the direction x orthogonal to y being denoted Dy.

In the case of a wafer that is opaque at the wavelength of the light source, the dimension Dz has no particular significance, as the surface for inspection must simply pass inside the measurement volume.

In the case of a wafer that is at least partially transparent at the wavelength of the light source, it is preferable to reduce the dimension Dz as far as possible, so as to have sufficient resolution on the position of any detected defects with respect to the thickness of the wafer. Generally, arrangements are made for the dimension Dz to be less than one quarter of the thickness of the wafer for inspection. In fact, beyond this ratio, large defects on the rear face of a transparent wafer can leave a significant signature which generates false detections.

The dimensions Dx and Dy are each chosen between 5 and 100 µm, preferably between 15 and 50 µm. The lower boundary equal to 5 µm is linked to the fact that below this dimension, the duration of inspection would be excessively long for a method implemented industrially. The upper boundary of 100 µm is defined in order to keep a flux that is as large as possible, allow a precise location of the defects on the surface of the wafer, and finally in order to reduce the probability of considering as a single defect, two defects that would just pass through the measurement volume simultaneously.

Purely by way of example, the measurement volume can have dimensions of 50×50 µm in the plane (x, y) or also 20×20 µm. The dimensions of the measurement volume are not necessarily equal in the directions x and y.

In order to obtain a measurement volume that is as small as in the present invention, it is generally necessary for the width of the beams at the level of the measurement volume to correspond to twice the minimum radius of said beams (known as the "waist" and commonly denoted $W_0$).

With D the diameter of these beams, F the focal length of the lens L1 and λ the wavelength of the light source, Gaussian optics makes it possible to obtain the following relationship:

$$2*W_0 = \frac{4 \cdot F \cdot \lambda}{\pi \cdot D}$$

It is thus possible to define the appropriate waist value by advantageously choosing the width of the beams at input, their spacing and the focal length of the output lens.

Furthermore, while the system described in the document WO 02/39099 only relates to wafers that are opaque at the wavelength of the beam, the present invention makes it possible to also inspect transparent substrates. In this case, it is sought moreover to carry out a detection which is as limited as possible in the thickness of the substrate, in the direction hereinafter called Z or depth of field.

A measurement volume created by two beams originating from the same source, which have a waist of size $W_0$, and which are incident with a half-angle α, is envisaged.

Unless otherwise indicated, the dimensions $W_0$, $D_y$, $D_z$, $D_z$ are expressed in width at $1/e^2$ of the maximum power.

The following relationships are obtained:

$$D_x = 2*W_0$$

$$D_y = \frac{2*W_0}{\cos(\alpha)}$$

$$D_z = \frac{2*W_0}{\sin(\alpha)}$$

$$\frac{D_x}{D_z} = \tan(\alpha)$$

In the case of a transparent substrate, of a thickness of 300 µm, it is sought for example to have a depth of field Dz of the order of 50 µm, with dimensions Dx and Dy of the order of 20 µm. Therefore a ratio Dx/Dz=0.4 is sought, i.e. an angle α of 21°.

In the event that the aim is a sensitive detection on a transparent substrate, it is sought to reduce $W_0$ as far as possible in order to increase the incident light flux: this is done by increasing the diameter of the laser upstream of the lens L1.

The reduction in Dz can be obtained by increasing α.

The invention thus makes it possible to determine the parameters for creating an optimal measurement volume for the detection of small defects on a substrate, including a transparent substrate, by varying only three parameters: the size of the beams at input, the separation of these beams upstream of the lens L1 and the focal length of this lens L1.

Returning to FIG. 2, the inspection system comprises in addition a device 40 for collecting the light scattered by the region of the wafer passing through the measurement volume.

According to an embodiment, this device 40 can comprise an optical fibre, preferably with a large core diameter (i.e.

typically between 50 and 2000 μm in diameter), the input of which is arranged at the focal length of an ellipsoid mirror or of a lens of a collection system composed of lenses and the output of which is coupled with a device 50 for acquiring collected light in order to emit an electrical signal representing the variation in the light intensity of the collected light as a function of time. Said device 50 typically comprises a photodetector.

According to an advantageous embodiment, the device 40 can be included in the device 30 for generating the measurement volume.

Thus, as shown in FIG. 3, the lens L1 making it possible to form the measurement volume is also used in order to collect the light scattered by the defects passing through the measurement volume (optical path represented by hatching). A second lens L2 arranged downstream of the lens L1 on the path of the collected light, between the incident beams, makes it possible to direct the collected light to an optical fibre or an acquisition device (not shown in FIG. 3). The solid angle of collection β is then generally limited by the angle of the incident beams.

The greater the angle α, the greater the solid angle β and the larger the quantity of collected light.

Generally, a solid angle is chosen that is greater than 0.1% of the hemisphere (or 0.0062 steradians). In fact, below this value, the quantity of collected light becomes very small and requires an acquisition time that is incompatible with an industrial implementation of the inspection method.

Figure 5:
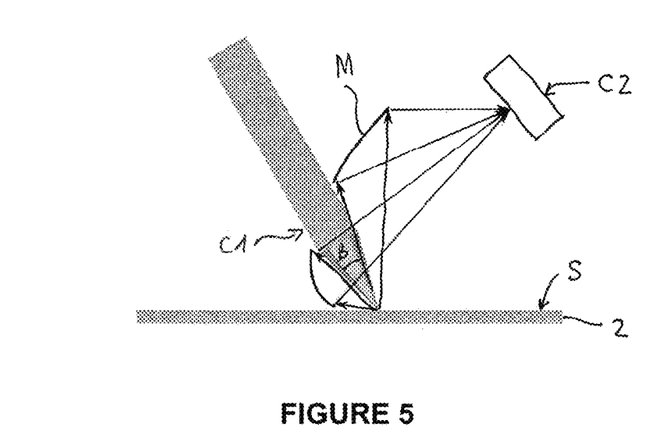
FIG. 5 is a schematic drawing of an inspection system comprising two light collection channels.

According to a variant embodiment, shown in FIG. 5, it is advantageous to combine the collection channel C1 arranged between the incident beams described above with a second collection channel C2 using a collection mirror M arranged so as to collect the light having a large scattering angle with respect to the normal to the surface S of the inspected wafer. This implementation makes it possible on the one hand to collect more light, and on the other hand to obtain more information on the different defects, as each channel makes it possible to obtain different information according to the defects.

Finally, the inspection system 1 comprises a processing device 60 (cf. FIG. 2) configured in order to detect, in said signal, a frequency component corresponding to the Doppler frequency.

The processing device 60 is a processor such as a central processing device (CPU) that is advantageously coupled with an interface, such as a computer (not shown) making it possible for a user to access the results of the inspection and display, record and/or print the results.

In order to inspect a wafer, said wafer 2 is put in place on the support 10 and the support is driven in rotation at a controlled angular velocity ω. By means of the encoders present on the support 10, the angular position of a given point of the wafer is known at each moment. The speed of rotation of the wafer is typically of the order of 5000 rpm.

In the inspection system 1, the interferometric device 30 and the collection device 40 are arranged facing a main surface of the wafer 2, on an arm (not shown) suitable for moving said devices 30, 40 in a radial direction. Conversely, the light source 20 as well as the acquisition and processing devices 50, 60 are located remotely and connected to the devices 30, 40 by optical fibres (not shown). The moveable part of the inspection system thus has a limited weight and space requirement, which facilitates its movement, while the light source, and the acquisition and processing devices, which are heavy, have a large space requirement, and are difficult to install, remain immobile. This also makes it possible to reduce the lengths of cables for conveying the electrical signal, which reduces the sensitivity to the surrounding electronic noises. Thus, taking account of the rotation of the wafer, it is possible to successively sweep the entire surface of the wafer with the measurement volume by moving the interferometric device radially in translational motion as well as the device for collecting the scattered light.

Arrangements are made for the interference fringes to extend transversally to the path of rotation of the wafer, so that a point on the surface of the wafer passes through at least one fringe, preferably several fringes, of the measurement volume. In the present text, by the term "transversally" is therefore meant that the fringes are perpendicular or inclined at a non-zero angle with respect to this path.

Comparative Results

Increase in Sensitivity

This paragraph gives the results in terms of sensitivity for a measurement volume of 40 μm by 2 mm (hereinafter denoted VM1) as in document WO 02/39099 and for a measurement volume of 40 μm by 40 μm (hereinafter denoted VM2), corresponding to an embodiment of the present invention. The dimension of the measurement volume in the direction perpendicular to the surface of the wafer does not matter in the present example.

The conditions of acquisition (common to both configurations of the measurement volume) are as follows.

The light source is a laser having a wavelength of 488 nm and a power of 100 mW.

The wafer is a silicon substrate with a diameter of 100 mm.

The dark field isolation (ratio of the light background to the input power, the light background corresponding to light pollution collected) is 90 dB.

The duration of acquisition is 60 s.

The number of measurement points per revolution is 1000 (tangential resolution).

The defect for detection has a diameter of 100 nm, which corresponds to a total cross-section, at 488 nm, of $3.5 \times 10^{-16}$ $m^2$ according to Mie's theory, using a spherical particle having an index of 1.58 in air. This model gives a good order of magnitude, according to the measurements carried out by the inventors.

The measurement chosen to characterize the sensitivity of a dark field system is the ratio between the signal light energy and the background light energy For the following calculations, it is assumed that the background light power is only linked to the quality of the collection optics and that it is proportional to the input light power.

During the detection of a defect, the ratio of the photon signal-to-noise ratio (ph-SNR)
linked to the statistics of detection—is proportional to the signal/√background ratio, which therefore depends on the input light power. The remainder of the disclosure relates to the signal/background ratio, as this is an indicator that is independent of the input light power.

The signal to light background ratio is calculated for a defect of 100 nm passing through each of the two measurement volumes VM1, VM2.

The geometry of these two measurement volumes, as well as the common acquisition parameters described above, involve a set of power and energy values per measurement point that are summarized below:

| Parameters deduced | | | | |
|---|---|---|---|---|
| | Flux [W/m²] | Number of revolutions | Duration of one revolution [s] | Duration of one acquisition point [s] |
| VM1 | 1250000 | 25 | 2.4 | 0.0024 |
| VM2 | 62500000 | 1250 | 0.048 | 0.000048 |

| Energy parameters deduced | | | | |
|---|---|---|---|---|
| | Signal power [W] | Signal energy [J] | Background light energy [J] | Signal to Light Background Ratio |
| VM1 | 4.4E−10 | 1.05E−12 | 2.40E−13 | 4.4 |
| VM2 | 2.2E−08 | 1.05E−12 | 4.80E−15 | 219 |

It is noted in these calculations that the signal energy is equal in both cases, which arises from the fact that the two phenomena (passing for a long duration through a measurement volume (VM1) with a low luminous flux/passing for a short duration through a measurement volume (VM2) with a high luminous flux) compensate for one another.

The advantage of the present invention is centred on the light background energy collected in both cases. The background light power depends only on the power sent and the collection used, which are the same in both cases. However, the measurement volume VM1 incorporates at each measurement point many more light background photons than the measurement volume VM2, hence a signal to light background ratio that is much more advantageous in the case of the measurement volume VM2.

A simple calculation makes it possible to deduce that the signal/background ratio gain is inversely equal to the ratio of the areas of each of the measurement volumes. In the case described here, $(Dx*Dy)_{VM2}/(Dx*Dy)_{VM1} = 1/50$, which does in fact correspond to the inverse of the signal/background gain.

Distinguishing Particles on Substrates that have a Surface Microroughness

It should be noted that the reduction in the size of the measurement volume is also a great advantage in the case of searching for small particles in the presence of microroughness of the substrate, which generates a light scattering also called "Haze". In fact, any substrate has a certain microroughness which depends on the quality of its polishing. This micro-roughness is substantially homogeneous on the surface and thus generates a substantially uniform scattering. Furthermore, unlike any particles that may be present at the surface, the entire surface of the substrate is affected by this microroughness.

Generally, this scattering (or haze) is measured in parts per million (or ppm) of the incident light power on the substrate.

The measured haze power does not depend on the surface of the measurement volume projected on the substrate, but only on the power of the light source and the roughness of the substrate. Thus, for a light power of 100 mW, and a scattering due to the microroughness of 1 ppm, the haze power received will be:

$P_{haze} = P_{laser} * Haze$ $P_{haze} = 0.1 * 1 * 10^{-7}$ $P_{haze} = 10 nW$

In this case, the following results are found in both configuration VM1 and VM2:

| | Haze power [W] | Signal power 100 nm particle [W] | Haze/Signal Ratio |
|---|---|---|---|
| VM1 WO 02/39099 | 1E−8 | 4.4E−10 | 0.044 |
| VM2 (present invention) | 1E−8 | 2.2E−8 | 22 |

Thus it is noted that in the case of the measurement volume VM1, the 100 nm particle is lost in the haze, as its scattered power is more than twenty times smaller than the haze power, while in the case of the measurement volume VM2 of the invention, the particle is in fact visible in the haze because its scattered power corresponds to more than double the haze power.

Thus, if the area of the measurement volume projected on the surface for inspection is reduced by a factor N, the Haze/Signal ratio is increased by this same factor N.

Increase in the Radial Resolution

The resolution of a dark field system is generally determined by the size of the beam scanning the surface to be inspected.

However, in document WO 02/39099, a means is proposed for having a better resolution by means of the variation in Doppler frequency of the defects passing through the measurement volume. In fact, a defect closer to the centre of rotation of the substrate has a linear velocity that is less than that of a defect distant from the centre of rotation of the substrate. By measuring this Doppler frequency, it is thus possible to locate the defect with greater accuracy than the size of the beam.

However, even if this theory is verified, it is demonstrated hereinafter that considering the measurement errors, this gain in resolution remains very small and in any case does not make it possible to reach the radial resolution obtained with the present invention.

In fact, considering a measurement volume of size 40 μm×2 mm with its major axis extending radially as described in the document WO 02/39099, and an inter-fringe distance of 1 μm, a measurement volume with 40 fringes is then obtained.

The width of the burst in microns is called l, the inter-fringe distance is called δ, the transit velocity of the defect through the measurement volume is called $V_t$, the scanned radius is called R, the angular velocity of rotation is called ω, and the Doppler frequency of the detected defect is called $f_d$.

The level of uncertainty with which it is possible to determine a frequency is linked to the width of the spectral peak of said frequency. Now, in the case of a burst of duration Δt, the spectral width of the peak is approximately $$\Delta f = \frac{1}{\Delta t}.$$

It is therefore sought to calculate Δf as a function of the number of fringes:

$$\Delta f = \frac{1}{\Delta t} = \frac{V_t}{l} = \frac{\delta \cdot f_d}{l}$$

Thus it is not possible to determine the Doppler frequency $f_d$ with an accuracy greater than $$\Delta f = \frac{\delta \cdot f_d}{l}.$$

It is known that the Doppler frequency in such a system is linked to the radial position, to the inter-fringe distance and to the angular velocity of rotation by the following relationship:

$$f_d = \frac{\omega \cdot R}{\delta}$$

Therefore, the relationship between the following uncertainties can be written as:

$$\Delta f_d = \frac{\omega}{\delta} \cdot \Delta R$$

The values ω and R here being constant.

Therefore for a given uncertainty $\Delta f_d$, an uncertainty on the radial position is obtained which is $$\Delta R = \frac{\delta}{\omega} \cdot \Delta f_d$$

Therefore it can be concluded by:

$$\Delta R = \frac{\delta}{\omega} \cdot \frac{\delta}{l} f_d = \frac{\delta}{l} \cdot R$$

This relationship therefore makes it possible for the uncertainty in the radial position determined using the Doppler frequency to be linked to the radius scanned, to the inter-fringe distance and to the width of the measurement volume. This uncertainty i, which is in this case equal to the radial resolution, is plotted on FIG. 6 as a function of the radius R for the values given above.

Figure 6:
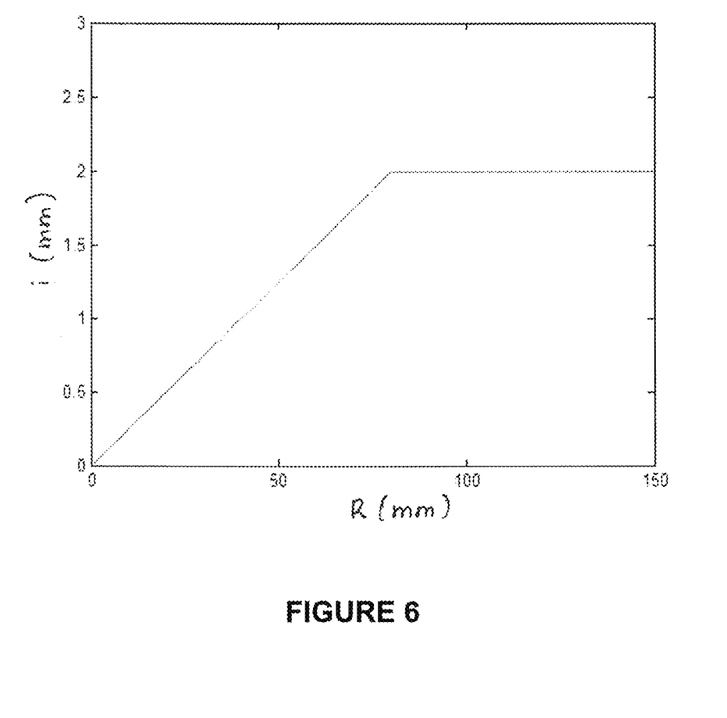
FIG. 6 is a graph showing the radial resolution as a function of the radial position of the measurement volume in the case of the measurement volume described in the document WO 02/39099.

It is noted in this example that the measurement volume presented in the document WO 02/39099 that the radial resolution reduces very quickly with the radius scanned, before finally being limited by the size of the measurement volume itself (plateau from 80 mm of radius scanned). For example, if a radial resolution of 50 μm is required, the scan radius is limited to 2 mm. In order to have a radial resolution of 50 μm over a wafer with a radius of 300 mm with an inter-fringe distance of 1 μm, it is then necessary to have a measurement volume of 333 μm in width, which further reduces the luminous flux (cf. previous considerations on sensitivity).

To the contrary, one of the advantages of the present invention is that the radial resolution is defined at minimum by the size of the measurement volume. In order to compensate for the smaller size of the measurement volume, the method according to the invention requires a more rapid rotation of the wafer than in the document WO 02/39099 in order to retain the same duration of inspection. However, the necessary speed is easily reached, as rapid-rotation "spindle" devices make it possible to rotate wafers up to 300 mm diameter at speeds of several thousand revolutions per minute. Furthermore, photodetectors and data acquisition cards operating at frequencies compatible with these speeds and the Doppler frequencies resulting therefrom are also available.

REFERENCES

WO 2009/112704
WO 02/39099

The invention claimed is:

1. A method for inspecting a wafer for electronics, optics or optoelectronics, the method comprising:
    rotating the wafer about an axis of symmetry (X) perpendicular to a main surface (S) of the wafer;
    emitting, from a light source coupled with an interferometric device, two incident light beams, so as to form, at an intersection between the two incident light beams, a measurement volume (V) containing interference fringes arranged such that a region of the main surface (S) of the wafer passes through at least one fringe of the measurement volume (V), a dimension of said measurement volume (V) in a radial direction of the wafer being between 5 and 100 μm (micrometers), wherein, at the location of the measurement volume (V), the two incident light beams have a minimum width (2×W₀), wherein W₀ is a value representing a minimum radius of the two incident light beams;
    collecting at least a portion of the light scattered by said region of the main surface (S) of the wafer;
    acquiring the collected portion of the light scattered and emitting an electrical signal representing a variation in the light intensity of the collected portion of the light scattered as a function of time; and
    detecting, in said electrical signal, a frequency component in said collected portion of the light scattered, said frequency component being a time signature of a passage of a defect through the measurement volume (V).

2. The method according to claim 1, wherein a dimension (Dx) of the measurement volume in a direction tangential to the path of rotation of the wafer is comprised between 5 and 100 μm.

3. The method according to claim 1, wherein the wafer is at least partially transparent at a wavelength of the light source.

4. The method according to claim 3, wherein a dimension (Dz) of the measurement volume in a direction perpendicular to the surface of the wafer is less than or equal to a quarter of the thickness of said wafer.

5. The method according to claim 1, wherein a power of the light source is greater than or equal to 10 mW (milliwatts).

6. The method according to claim 1, wherein a wavelength of the light source is less than or equal to 900 nm (nanometers).

7. The method according to claim 1, wherein an inter-fringe distance is between 0.1 and 10 μm.

8. A system for inspecting wafers for microelectronics or optics, the system comprising:
    a drive device for driving a wafer in rotation about an axis (X) of symmetry perpendicular to a main surface (S) of said wafer;
    a light source suitable for emitting a light beam;
    an interferometric device coupled with the light source to split the light beam emitted by said light source into two light beams and in order to form, at an intersection between the two light beams, a measurement volume (V) containing interference fringes, a dimension of said measurement volume (V) in a radial direction of the wafer being comprised between 5 and 100 μm (micrometers), the interferometric device and the drive device being arranged in relation to one another so that a region of the main surface of the wafer in rotation passes through at least one fringe of the measurement volume, wherein, at the location of the measurement volume (V), the two incident light beams have a minimum width ($2 \times W_0$), wherein $W_0$ is a value representing a minimum radius of the two incident light beams;

a collection device for collecting light scattered by the wafer;

an acquisition device including a photodetector and configured for acquiring the collected light from aid collection device and configured to emit an electrical signal representing a variation in the light intensity of the collected light scattered by the wafer as a function of time; and a processing device configured to detect, in said electrical signal, a frequency component in said collected light scattered by the wafer, said frequency component being a time signature of a passage of a defect through a respective measurement volume and in order to determine, based on said frequency component, the position of the defect in the radial direction of the wafer or in the thickness of the wafer.

9. The system according to claim 8, further comprising an arm for moving the interferometric device and the collection device for collecting scattered light in translational motion in the radial direction of the wafer, wherein the light source, the acquisition device and the processing device are immobile.

10. The system according to claim 9, wherein said interferometric device is coupled with the light source by an optical fiber and said collection device is coupled with the acquisition device by an optical fiber.

* * * * *